(12) United States Patent
Subramanya et al.

(10) Patent No.: US 11,194,091 B2
(45) Date of Patent: Dec. 7, 2021

(54) OPTICAL LIGHT GUIDE SYSTEMS FOR LOW Z-HEIGHT LED ARRAYS

(71) Applicant: Lumileds LLC, San Jose, CA (US)

(72) Inventors: Sudhir Subramanya, Dublin, CA (US); Willem Sillevis-Smitt, San Jose, CA (US); Frederic Diana, San Jose, CA (US); Charles Schrama, San Jose, CA (US); Alan McReynolds, San Jose, CA (US); Yifing Qiu, San Jose, CA (US)

(73) Assignee: Lumileds LLC, San Jose, CA (US)

( * ) Notice: Subject to any disclaimer, the term of this patent is extended or adjusted under 35 U.S.C. 154(b) by 0 days.

(21) Appl. No.: 16/584,635

(22) Filed: Sep. 26, 2019

(65) Prior Publication Data

US 2020/0103581 A1 Apr. 2, 2020

Related U.S. Application Data

(60) Provisional application No. 62/738,607, filed on Sep. 28, 2018.

(30) Foreign Application Priority Data

Dec. 11, 2018 (EP) .................................... 18211515

(51) Int. Cl.
*F21V 8/00* (2006.01)
*F21K 9/23* (2016.01)
(Continued)

(52) U.S. Cl.
CPC .............. *G02B 6/0073* (2013.01); *F21K 9/23* (2016.08); *F21V 5/004* (2013.01);
(Continued)

(58) Field of Classification Search
CPC ................................ G02B 6/035; F21V 5/004
(Continued)

(56) References Cited

U.S. PATENT DOCUMENTS 6,948,838 B2 * 9/2005 Kunstler ............... F21V 7/0091
362/545
7,229,199 B2 * 6/2007 Lee .................. G02F 1/133602
362/240

(Continued)

FOREIGN PATENT DOCUMENTS

WO 2018/185475 A1 10/2018
WO 2020069443 A1 4/2020

OTHER PUBLICATIONS

International Search Report corresponding to PCT/US2019/053656 dated Nov. 27, 2019, 6 pages.
(Continued)

*Primary Examiner* — Laura K Tso

(57) ABSTRACT

A light source includes a plurality of light emitting diodes, with at least some light emitting diodes sized between 30 microns and 500 microns. A plurality of micro-optics are associated with a light guide plate and sized less than 1 millimeter, with each micro-optic positioned over at least one of the plurality of light emitting diodes. At least some of the combinations of light emitting diode and micro-optics associated with the light guide plate are positioned within a distance to each other sufficient to provide a substantially uniform light beam.

19 Claims, 5 Drawing Sheets

(51) Int. Cl.
    *H01L 27/15*     (2006.01)
    *F21V 29/75*     (2015.01)
    *F21V 29/76*     (2015.01)
    *F21V 5/00*     (2018.01)
    *F21V 19/00*     (2006.01)
    *F21Y 105/16*     (2016.01)
    *F21Y 113/13*     (2016.01)
    *F21Y 115/10*     (2016.01)

(52) U.S. Cl.
    CPC .......... *F21V 19/0025* (2013.01); *F21V 29/75* (2015.01); *F21V 29/763* (2015.01); *G02B 6/0035* (2013.01); *H01L 27/156* (2013.01); *F21Y 2105/16* (2016.08); *F21Y 2113/13* (2016.08); *F21Y 2115/10* (2016.08); *G02B 6/0085* (2013.01)

(58) Field of Classification Search
    USPC .................. 362/235, 236, 237, 244, 246
    See application file for complete search history.

(56) References Cited

U.S. PATENT DOCUMENTS

| | | | |
|---|---|---|---|
| 8,573,822 B2 * | 11/2013 | Ishihara | ................ F21S 43/235 362/522 |
| 8,746,909 B2 | 6/2014 | Chen et al. | |
| RE47,241 E | 2/2019 | D'Evelyn et al. | |
| 2007/0058359 A1 * | 3/2007 | Saitoh | ............... G02F 1/133606 362/97.3 |
| 2009/0009506 A1 | 1/2009 | Lee et al. | |
| 2011/0315956 A1 | 12/2011 | Tischler et al. | |
| 2015/0295154 A1 | 10/2015 | Tu et al. | |
| 2016/0123541 A1 | 5/2016 | Quilici et al. | |
| 2016/0298822 A1 * | 10/2016 | Michiels | ................. F21V 5/002 |
| 2016/0363747 A1 | 12/2016 | Krijn et al. | |
| 2017/0102125 A1 * | 4/2017 | Saito | .................. G02B 19/0014 |
| 2017/0254518 A1 | 9/2017 | Vasylyev | |
| 2018/0136463 A1 * | 5/2018 | Nambara | ................. G02B 3/08 |
| 2020/0103091 A1 | 4/2020 | Subramanya et al. | |
| 2020/0103581 A1 | 4/2020 | Subramanya et al. | |
| 2020/0105827 A1 | 4/2020 | Subramanya et al. | |

OTHER PUBLICATIONS

Written Opinion of the International Searching Authority corresponding to PCT/US2019/053656 dated Nov. 27, 2019, 6 pages.
USPTO Non-Final Office Action corresponding to U.S. Appl. No. 16/584,628 dated Jul. 8, 2021, 9 pages.
USPTO Non-Final Office Action in U.S. Appl. No. 16/584,641 dated Feb. 17, 2021, 20 pages.

\* cited by examiner

OPTICAL LIGHT GUIDE SYSTEMS FOR LOW Z-HEIGHT LED ARRAYS

CROSS REFERENCE TO RELATED APPLICATIONS

This application claims benefit of priority to U.S. Provisional Patent Application No. 62/738,607 filed Sep. 28, 2018 and to European Patent Application No. 18211515.4 filed Dec. 11, 2018, each of which is incorporated herein by reference in its entirety. Further, this application is related to co-pending U.S. Non-provisional patent application Ser. No. 16/584,628 filed Sep. 26, 2019 and U.S. Non-provisional patent application Ser. No. 16/584,641 filed Sep. 26, 2019.

TECHNICAL FIELD

The present disclosure relates generally to micro-LED lighting systems. In certain embodiments, low Z-height LED arrays with associated light guide plates are described.

BACKGROUND

Providing uniformly illuminated light panels suitable for home, retail, office, or architectural installation can be difficult. One commonly used system relies on a large number of edge mounted LEDs that direct light into a light guide panel. A light guide panel can be formed from an acrylic, polycarbonate, or other transparent material. On the bottom face of a panel a large number of dots are printed, lines scratched, or cavities etched. These dots, lines, or cavities redirect or diffuse internally reflected light from edge mounted LEDs, providing a generally uniform lighting effect. Unfortunately, providing uniform lighting for larger panels (e.g. meter scale) can be difficult, since edge light must be directed to the center of the panel.

One alternative to light guide plates with edge mounted LEDs is found in light plate diffuser systems. A single LED and associated beam spreading optic is used to direct light toward a light diffuser panel. While this provides uniform lighting, centimeter to meter scale light diffuser panel systems can require a substantial Z-height to accommodate the distance between an LED source and a diffuser panel. Additional height may be required for beam spreaders, diffusers, mirrors, or other light modification structures. Even more Z-height can be attributed to millimeter to centimeter scale cooling or heat transfer structures, electronic components, mounting elements, or multiple layer printed circuit boards.

One way of reducing Z-height of a light panel diffuser system is to replace a large LED set at a far distance with a number of close set distance LEDs distributed to uniformly illuminate the light diffuser panel. However, even if similar total luminous output is provided, this is not always an adequate solution. Instead of a single optic or diffuser that presents a relatively uniform appearance, multiple LEDs and optics can provide an unsatisfactory cluttered appearance. Typically, the LED package appearance and projected light of such LED systems is not uniform, with bright spots and shadowing being present in the LED package, and individual projected beams being recognizable in illuminated areas. Further, due to separated light beams, illuminated objects will appear to have multiple shadows in response to direct illumination. LED systems that have a low Z-height, present a uniform visual appearance, and minimize shadowing or other visual artifacts of multiple beams are needed.

SUMMARY

In one embodiment, a programmable light source useful for architectural lighting, general lighting, street lighting, or other lighting applications includes a plurality of light emitting diodes. A least some light emitting diodes can be sized between 30 microns and 500 microns. Positioned in contact or adjacent to the light emitting diodes is a light wave guide having a first and second surface. The plurality of light emitting diodes can be separated from each other and positioned to direct light substantially perpendicular to the first surface into the light wave guide. Optical structures associated with the light guide plate are aligned with each of the plurality of light emitting diodes to modify beam direction of light exiting the second surface.

In one embodiment, a plurality of light emitting diodes are attached or positioned near a light guide plate. At least some light emitting diodes are sized between 30 microns and 500 microns and can be attached to a printed circuit board or other suitable substrate. A plurality of micro-optics can be associated with a light guide plate and are sized less than 1 millimeter, with each micro-optic positioned over at least one of the plurality of light emitting diodes. The combined height of each of the plurality of light emitting diodes, their supporting substrate, and associated micro-optics is less than 1 centimeter. In some embodiments, each combination of light emitting diode and associated micro-optic is positioned within a distance to each other sufficient to both present a substantially uniform visual appearance and provide a substantially uniform light beam.

Optical structures can plurality of micro-optics defined or attached to the light guide plate and sized less than 1 millimeter. The micro-optics can be positioned over at least one of the plurality of light emitting diodes. Typically, the micro-optics are sized to be similar or larger in size than the light emitting diodes. In some embodiments, each combination of light emitting diode and associated micro-optic can be positioned within a distance to each other sufficient to both present a substantially uniform visual appearance and provide a substantially uniform light beam. This distance can be selected so the combined light emitting diode and associated micro-optic are positioned to be separated by no more than a Rayleigh limit distance calculated for a user at a normal distance from the light source. In some embodiments, each of the plurality of light emitting diodes are positioned at least 1 millimeter apart.

In some embodiments a controller is connected to selectively power groups of the plurality of light emitting diodes to provide different light beam patterns.

In some embodiments the height of the light emitting diodes, their supporting substrate and electrical traces, and associated micro-optics is less than 5 millimeters.

In some embodiments light emitting diodes can be embedded in a solid or a flexible substrate, which can be at least in part transparent. For example, the light emitting diodes can be at least partially embedded in glass, ceramic, or polymeric materials. At least some of the plurality of light emitting diodes can be individually controlled through connected electrical traces. In other embodiments, groups or sub-groups of light emitting diodes can be controlled together.

In some embodiments the plurality of light emitting diodes can have distinct non-white colors. For example, at least four of the plurality of light emitting diodes can be RGBY groupings of light emitting diodes.

In another embodiment, at least two of the plurality of light emitting diodes are positionable under a single micro-optic. Alternatively, each light emitting diodes can be positioned under a single micro-optic. Some of the plurality of light emitting diodes can be positioned under a single on-axis micro-optic, while others can be positioned under a single off-axis micro-optic. In some embodiments the micro-optics are defined in an optical sheet positionable over at least some of the plurality of light emitting diodes.

DETAILED DESCRIPTION

Figure 1A:
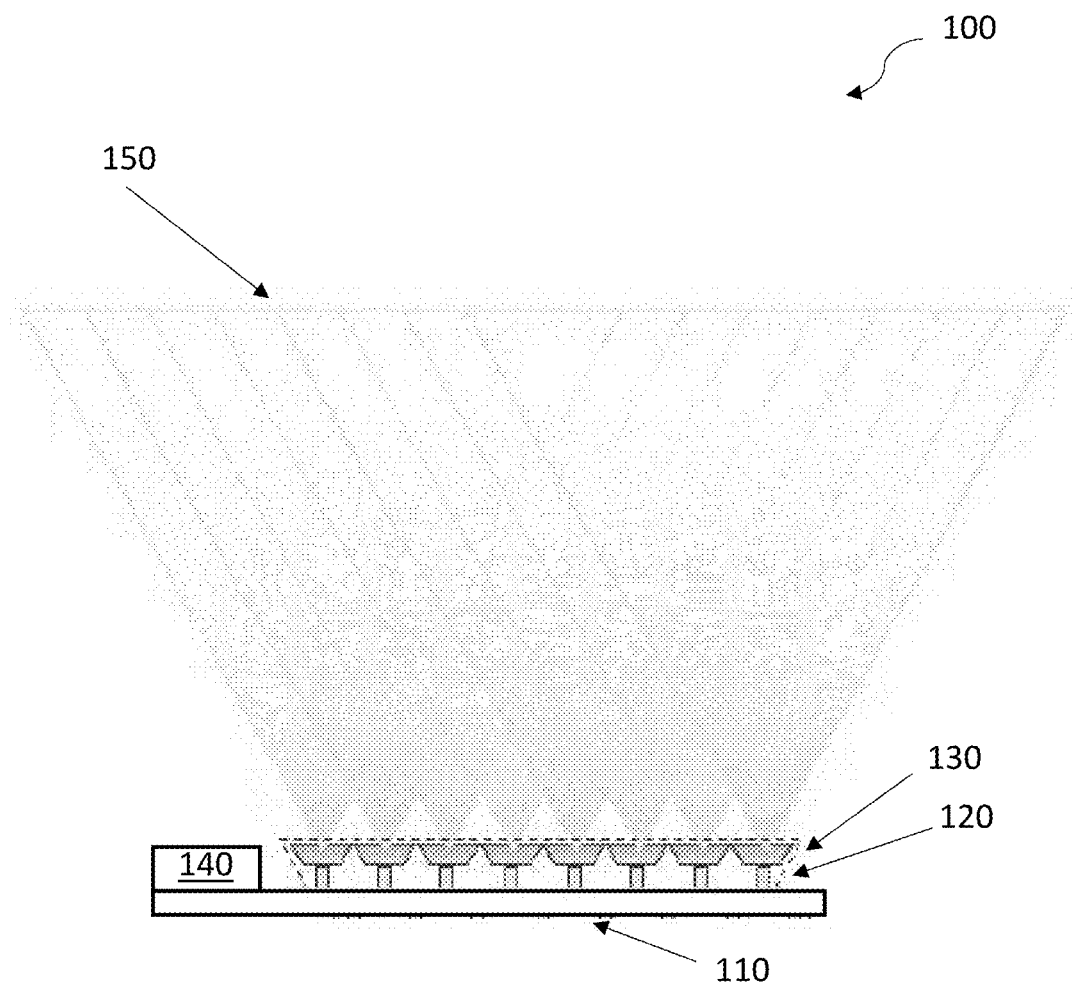
FIG. 1A is a diagram illustrating a LED illumination system with multiple millimeter-scale spaced apart LEDs and micro-optics supported by a substrate.

FIG. 1A is a diagram illustrating a LED illumination system 100 with multiple millimeter-scale spaced-apart LEDs 120 that form a sparse array and associated micro-optics 130 supported by a substrate 110. LED activation and light intensity can be controlled by controller 140. Light emitted from LEDs 120 follow light beam paths 150. The light beam paths can be substantially distinct or at least partially overlapping as indicated in FIG. 1. In some embodiments, the light beams can be used to illuminate a light diffuser panel. In other embodiments to be discussed with respect to FIG. 5, the LEDs 120 can be used to direct light into a light guide plate.

In some embodiments, at least some LEDs 120 are sized between 30 microns and 500 microns in length, width, and height. The micro-optics 130 are sized to be less than 1 millimeter in length, width, and height and are positioned over at least some of the LEDs 120. Typically, the micro-optics are sized to be similar or larger in size than the LEDs 120. In some embodiments the height of the LEDs 120, their supporting substrate and any electrical traces, and associated micro-optics 130 is less than 5 millimeters in combination.

The controller 140 is connected to selectively power groups LEDS 120 to provide different light beam patterns 150. The controller 140 can be mounted on, beneath, or adjacent to substrate 110. Alternatively, the controller can be mounted separately from the substrate 110 and use wired connections, board connected electrical traces, or another suitable interconnect mechanism. The LED controller 140 can include necessary circuitry so as to enable the operation of the plurality of LEDs 120. The LED controller can be unitary or be composed of multiple distinct modules in wired or wireless interconnection. For example, the LED controller 140 can include a separate power supply, a wireless interconnect, and remote logic on a dedicated light interface device or app supported by a smartphone.

The substrate 110 can include a laminated printed circuit board, a ceramic board, glass board, or plastic board. The substrate can be rigid or flexible. Furthermore, the substrate 110 can include the necessary traces and circuitry to enable individual or grouped operation of the LEDs 120. Electrical connection between controller 140 and LEDs 120 can be formed by direct wiring, electrical trace layout, side or bottom vias, or suitable combinations thereof. In certain embodiments, transparent conductors such as indium tin oxide (ITO) can be used to form top or side contacts.

In some embodiments, each LED can be separately controlled by controller 140, while in other embodiments groups of LEDs can be controlled as a block. In still other embodiments, both single LEDs and groups of LEDs can be controlled. To reduce overall data management requirements, the controller 140 can be limited to on/off functionality or switching between relatively few light intensity levels. In other embodiments, continuous changes in lighting intensity are supported. Both individual and group level control of light intensity is contemplated. In one embodiment, overlapping or dynamically selected zones of control are also possible, with for example, overlapping groups of LEDs 120 being separately controllable despite having common LEDs depending on lighting requirements. In one embodiment, intensity can be separately controlled and adjusted by setting appropriate ramp times and pulse width for each LED using a pulse width modulation module within controller 140. This allows staging of LED activation to reduce power fluctuations, and to provide superior luminous intensity control.

The LEDs 120 can include but are not limited to LEDs formed of sapphire or silicon carbide. The LEDs 120 can be formed from an epitaxially grown or deposited semiconductor n-layer. A semiconductor p-layer can then be sequentially grown or deposited on the n-layer, forming an active region at the junction between layers. Semiconductor materials capable of forming high-brightness light emitting devices can include, but are not limited to, Group III-V semiconductors, particularly binary, ternary, and quaternary alloys of gallium, aluminum, indium, and nitrogen, also referred to as III-nitride materials. In certain embodiment, laser light emitting elements can be used.

Color of emitted light from the LEDs 120 can be modified using a phosphor contained in glass, or as a pre-formed sintered ceramic phosphor, which can include one or more wavelength converting materials able to create white light or monochromatic light of other colors. All or only a portion of the light emitted by the LEDs 120 may be converted by the wavelength converting material of the phosphor. Unconverted light may be part of the final spectrum of light, though it need not be. Examples of common devices include a blue-emitting LED segment combined with a yellow-emitting phosphor, a blue-emitting LED segment combined with green- and red-emitting phosphors, a UV-emitting LED segment combined with blue- and yellow-emitting phosphors, and a UV-emitting LED segment combined with blue-, green-, and red-emitting phosphors. In some embodiments, individually controllable RGB (three LEDs) or RGBY (four LEDs) can be positioned under a single micro-optic. This allows for precise color control of emitted light. Typically, such RGB LEDs are spaced sufficiently far apart that color mixing will occur in the far field.

Direction, beam width, and beam shape of light emitted from each LED 120 can be modified by micro-optics 130. Micro-optics 130 can be a single optical element or a multiple optic elements. Optical elements can include converging or diverging lenses, aspherical lens, Fresnel lens, or graded index lens, for example. Other optical elements such as mirrors, beam diffusers, filters, masks, apertures, collimators, or light waveguides are also included. Micro-optics 130 can be positioned at a distance from the LEDs that allows receipt and redirection of light from multiple LEDs 120. Alternatively, micro-optics 130 can be set atop each LED 120 to individually guide, focus, or defocus emitted LED 120 light. Micro-optics 130 can be directly attached to the LEDs 120, attached to LEDs 120 via a transparent interposer or plate, or held at a fixed distance from LEDs 120 by surrounding substrate attachments (not shown).

Figure 1B:
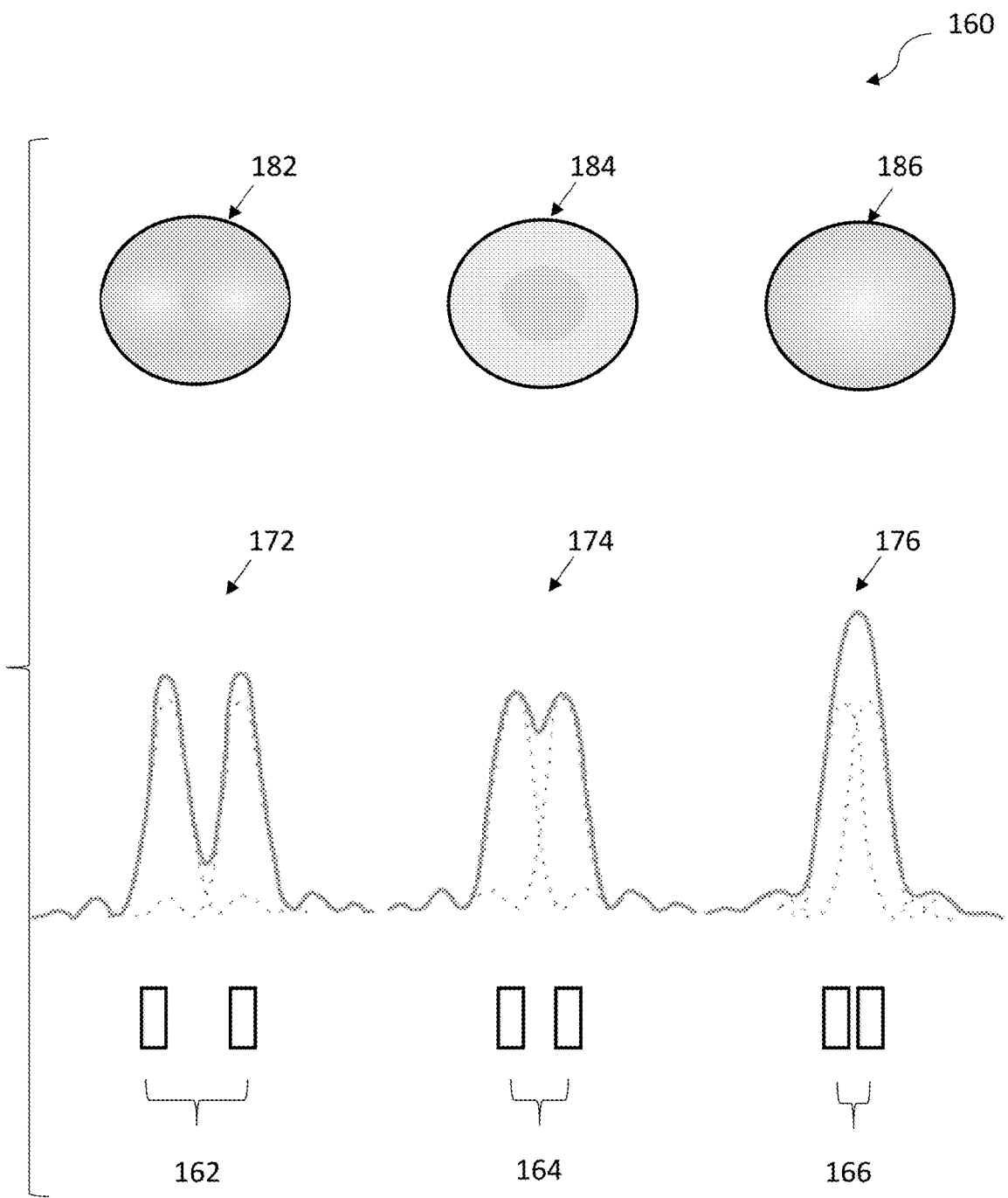
FIG. 1B is a diagram illustrating a Rayleigh distance separation of millimeter-scale spaced apart LEDs and micro-optics.

In one embodiment, LEDS are situated no further apart from each other than is necessary to present a substantially uniform visual appearance and provide a substantially uniform light beam. This requires that point-like sources be separated by distance that defines an angle smaller than the resolvable angular resolution for a user viewing at a normal distance (e.g. the distance from a standing or sitting user to light in a ceiling). FIG. 1B illustrates this with a graphic 160 illustrating a Rayleigh distance separation of millimeter-scale spaced apart LEDs and micro-optics. As seen in graph 160, pairs of LEDs 162, 164, and 166 are separated by an increasingly smaller distance. LEDs 162 are separated from each other by a distance and corresponding viewable angular separation at a distance (e.g. typically 1-2 meters) sufficient to distinguish each LED as a separate light source. A user looking at the LEDs would clearly see two distinct bright spots 182 having distinct dual light intensity peaks 172.

Placing the LEDs closer together can eliminate the perception of distinct bright spots. LEDs 166 are so closely spaced that the individual light intensity peaks from each LED beam are combined into a single peak 176 that presents a generally uniform visual impression, with some slight brightening 186 in the center.

Placing the LEDs 164 at an intermediate distance determined to be a Rayleigh distance separation or smaller can provide light intensity peaks 174 that are basically indistinguishable, giving a generally uniform visual impression 184. Rayleigh distance can be determined by considering diffraction through a circular aperture, which is:

$$\theta = 1.220 \frac{\lambda}{D}$$

where θ is the angular resolution (radians), λ is the wavelength of light, and D is the pupil diameter of a user viewing the separated LEDs. Determining the Rayleigh distance allows a further determination of LED spacing for a user viewing the LEDs at a distance typically between 1-2 meters distant. Typically, this LED separation distance will be 1 millimeter or less for sub-millimeter sized LEDs with associated micro-optics. In some embodiments, this distance can be increased by providing diffuser layers, wide beam optics, or mirror systems. Unfortunately, this reduces ease of manufacture and increases both the Z-height and expense of the LED systems.

Figure 1C:
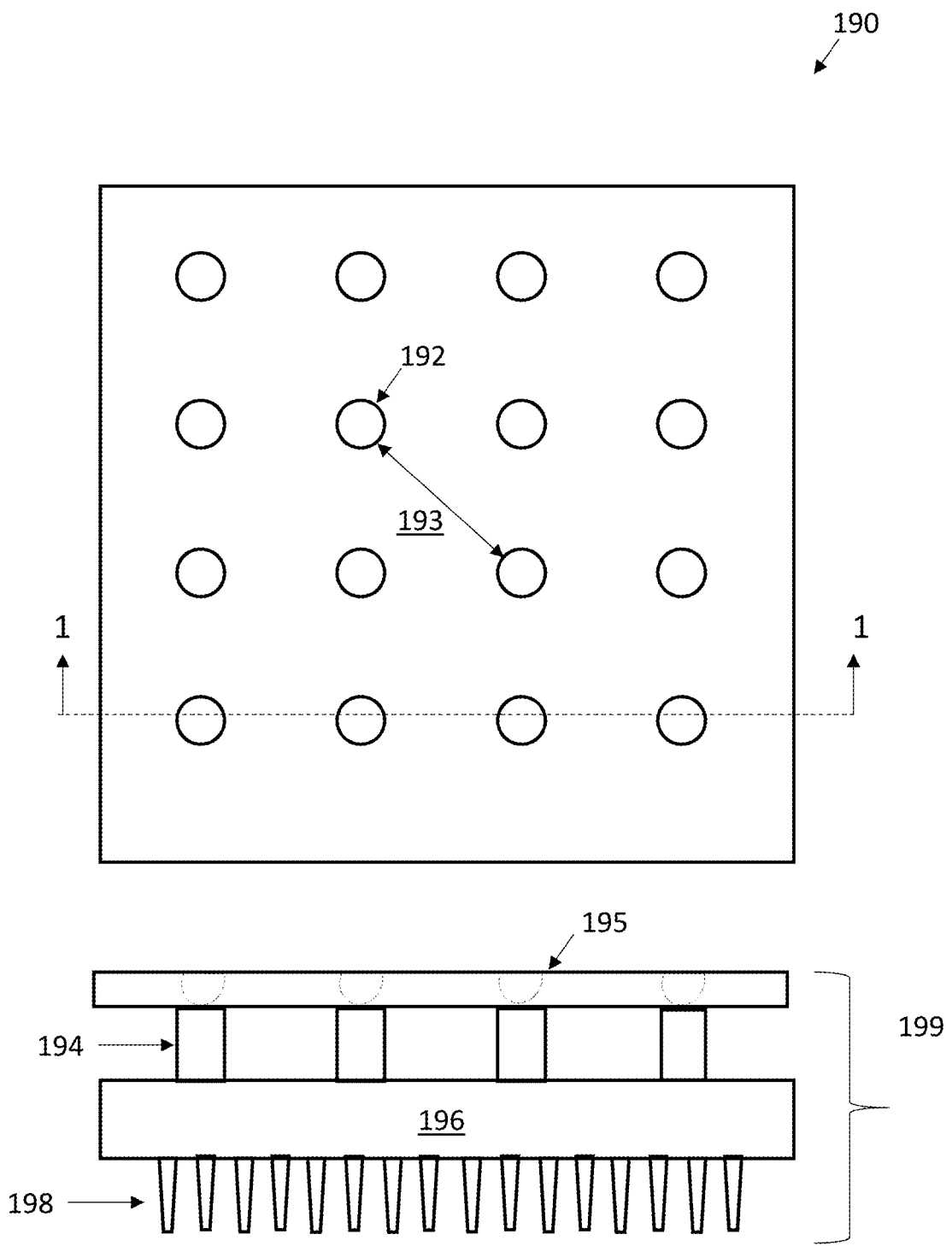
FIG. 1C is a diagram illustrating a low Z-height LED illumination system with multiple millimeter-scale spaced apart LEDs and micro-optics supported by a substrate.

FIG. 1C is a diagram illustrating a low Z-height LED illumination system 190 with multiple millimeter-scale spaced apart 193 LED units 192 formed from a combination of LEDs 194 and sheet embedded micro-optics 195. The LEDs 194 are supported by a substrate 196 (e.g. a printed circuit board or ceramic substrate that supports electrical traces or vias) that has attached heat spreader fins 198. The total Z-height 199 of the system is minimized, with a Z-height typically being less than 1 centimeter for millimeter or less sized LED sources. In some embodiments, Z-height for the LED illumination system 190 is set to be no greater than five (5) times the height of the LEDs 194.

Figure 2:
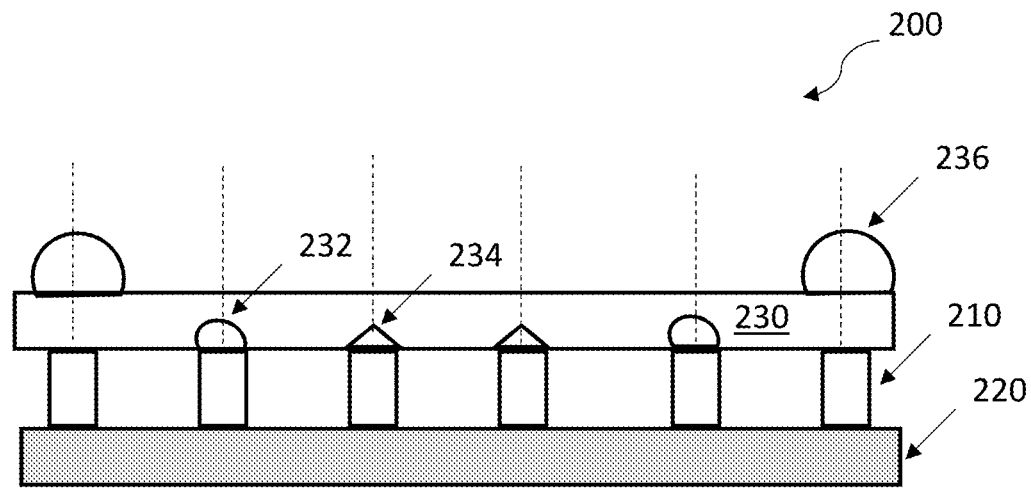
FIG. 2 illustrates a light guide plate with attached multiple millimeter-scale spaced apart LEDs and various micro-optics.

Low Z-height systems can support various light beam orientations. For example, FIG. 2 illustrates an illumination system 200 with multiple millimeter-scale spaced apart LEDs 210 supported on a substrate 220. The multiple millimeter-scale spaced apart LEDs can be symmetrically arranged in lines or arrays. Alternatively, they can be arranged to have non-symmetric, irregular spacing. Every LED 210, or selected subgroups of LEDs 210, can be spaced at a Rayleigh distance separation or smaller. One-dimensional, two-dimensional, and three-dimensional non-symmetric or irregular layouts of LEDs with associated micro-optics is contemplated. Two-dimensional layouts can be constructed from adjacent or contiguous positioning of one-dimensional substrates. Three-dimensional layouts can be constructed from multiple stacked layers of two-dimensional substrates. Stacked substrates can be transparent, or include defined apertures offset from supported LEDs to permit exit of light from lower layers. In other embodiments, symmetrical one-dimensional, two-dimensional, and/or three-dimensional arrays of LEDs can be used, as well as combinations of symmetrical and non-symmetrical layouts.

FIG. 2 also illustrates a light guide plate 230 formed to include optics or other light modification structures positioned near or adjacent to each of the LEDs 210. Optical structures can be defined by embossing, etching, or additive emplacement on one or both sides of the light guide plate. For example, circular cavities 232 or pyramidal cavities 234 can be defined on one side, with additively manufactured lens 236 provided on the opposing side. Additionally, dots can be printed, lines scratched, or cavities etched to affect light exit from the light guide plate 230.

Figure 3:
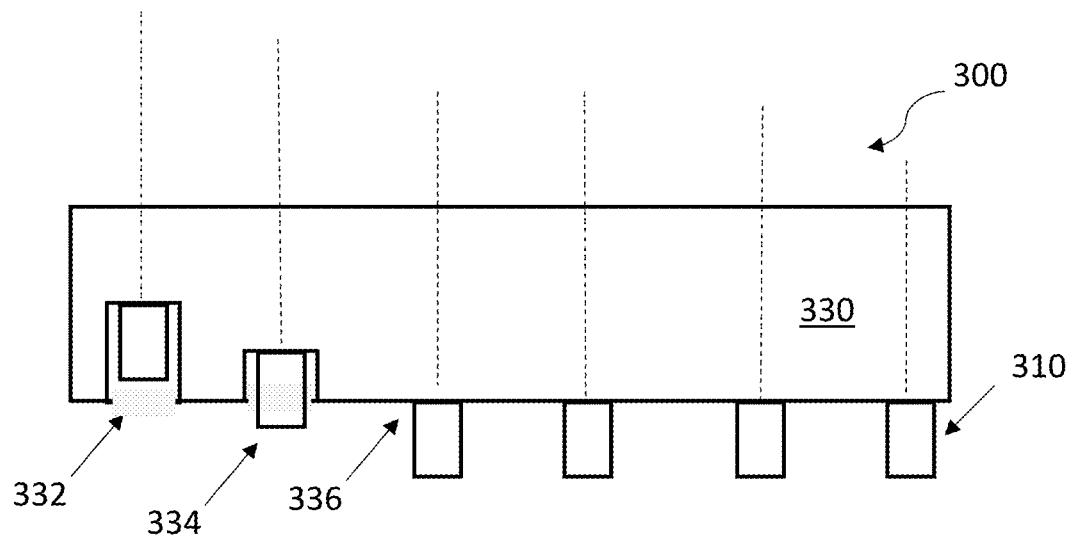
FIG. 3 illustrates a light guide plate with surface or cavity attached multiple millimeter-scale spaced apart LEDs.

FIG. 3 illustrates another embodiment of a low Z-height light guide plate system 300 in which LEDS 310 are attached directly to a light guide plate surface (336) or attached wholly (332) or partially (334) within a defined cavity in a light guide plate 330. Every LED 310, or selected subgroups of LEDs 310, can be spaced at a Rayleigh distance separation or smaller. In some embodiments, the light guide place has a thickness from 50 to 100 microns, 100 to 500 microns, 0.5 to 1 mm, 1 mm to 5 mm, or 5 mm to 10 mm. In certain embodiments, LEDs 310 have a width from 30 microns to 500 microns. In other embodiments, LEDs 310 have a width and/or length from 5 to 10 µm, 10 to 50 µm, or 50 to 500 µm. In certain embodiments, each of the LEDs 310 has with a height from 2 to 10 µm, 10 to 200 µm, or 200 to 500 µm.

Attachment methods may include adhesive attachment. In some embodiments, pick and place machines can be used to individually position LEDs 310. In other embodiments, transfer forms or tacky sheets can be used to transfer multiple LEDs at the same time. In those embodiments including cavity attachment sites, numbers of LEDs can be placed and mechanically shaken on the light guide plate until the LEDs drop into suitable cavities. As other examples, elastomer stamps or electrostatic stamp (or other transfer device), can be used for pick-up and transport to a light guide plate. In some embodiments this process can be performed in parallel, with dozens to hundreds LEDs transferred in a single pick-up-and-print operation.

LED power and control can be provided by applied conductive traces that are connected to suitable control and power circuitry. The conductive traces can be formed from conductive inks, conductive polymers, solder, conducting graphene, or other suitable material that can be lithographically or directly printed, or applied by stamping, or other suitable application method.

Figure 4A:
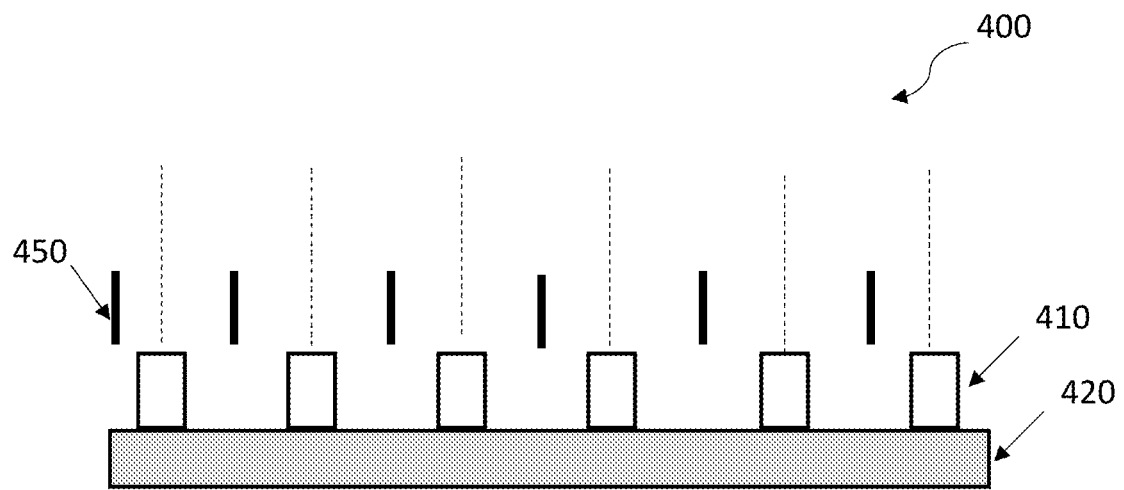
FIGS. 4A and 4B illustrates in respective side and top view a LED illumination system with multiple millimeter-scale spaced apart LEDs and an overlaying glare shield.
Figure 4B:
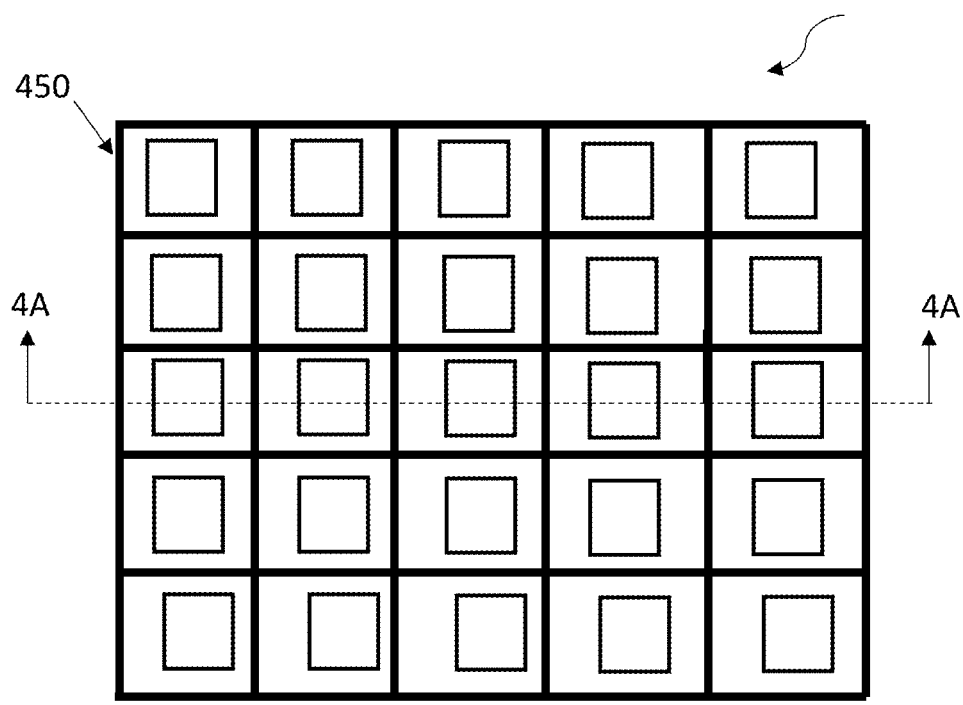

FIGS. 4A and 4B respectively illustrate in side (FIG. 4A) and top view (FIG. 4B) another embodiment 400. A low profile glare reduction structure 450 is situated over LEDs 410 that are attached to a substrate 420. Shields can be formed from a light blocking or reflective material the limits glare by reducing off-axis light beams. Every LED 210, or selected subgroups of LEDs 210, can be spaced at a Rayleigh distance separation or smaller.

The disclosed low Z-height systems can be used in various lighting applications. For example, downlights able to provide 1,500 lm can be constructed with 300 mini LEDs of 0.2×0.2 mm and further being 25d with 1.1 mm optic height. The specific light pattern can take any shape including line, square, or open circle. In another application, spotlights that are track mounted or ceiling recessed can be constructed to provide 1,500 lm with 300 mini LEDs of 0.2×0.2 mm and further being 15d with 2.0 mm optic height. An optional 2 mm high glare shield can also be used. Such lights can be embedded in the track system or can become part of a suspended light system. In still another embodiment, high intensity stadium lights able to provide 10,000 lm units can be constructed from 1,250 LEDs/unit. Even such powerful lighting systems will only require a 2.0 mm optic height. Mobile lighting applications are also supported. For example, a camera flash system can be designed to use 100 LEDs sized from 0.1 to 0.2 mm. The LEDs can be of one or more colors, and can be arranged to be selectively activated to provide a required flash light intensity at a desired color temperature.

Programmable light emitting arrays such as disclosed herein may also support a wide range of applications that benefit from fine-grained intensity, spatial, and temporal control of light distribution. This may include, but is not limited to, precise spatial patterning of emitted light from blocks or individual LEDs. Depending on the application, emitted light may be spectrally distinct, adaptive over time, and/or environmentally responsive. In some embodiments, the light emitting arrays may provide pre-programmed light distribution in various intensity, spatial, or temporal patterns. The emitted light may be based at least in part on received sensor data and may be used for optical wireless communications. Associated optics may be distinct at single or multiple LED level. An example light emitting array may include a device having a commonly controlled central block of high intensity LEDS with an associated common optic, whereas edge positioned LEDs may have individual optics. Common applications supported by light emitting LED arrays include camera or video lighting, architectural and area illumination, and street lighting.

Programmable light emitting arrays may be used to selectively and adaptively illuminate buildings or areas for improved visual display or to reduce lighting costs. In addition, light emitting arrays may be used to project media facades for decorative motion or video effects. In conjunction with tracking sensors and/or cameras, selective illumination of areas around pedestrians may be possible. Spectrally distinct LEDs may be used to adjust the color temperature of lighting, as well as support wavelength specific horticultural illumination.

Street lighting is an important application that may greatly benefit from use of programmable light emitting arrays. A single type of light emitting array may be used to mimic various street light types, allowing, for example, switching between a Type I linear street light and a Type IV semicircular street light by appropriate activation or deactivation of selected LEDs. In addition, street lighting costs may be lowered by adjusting light beam intensity or distribution according to environmental conditions or time of use. For example, light intensity and area of distribution may be reduced when pedestrians are not present. If LEDs are spectrally distinct, the color temperature of the light may be adjusted according to respective daylight, twilight, or night conditions.

Many modifications and other embodiments of the invention will come to the mind of one skilled in the art having the benefit of the teachings presented in the foregoing descriptions and the associated drawings. Therefore, it is understood that the invention is not to be limited to the specific embodiments disclosed, and that modifications and embodiments are intended to be included within the scope of the appended claims. It is also understood that other embodiments of this invention may be practiced in the absence of an element/step not specifically disclosed herein.

The invention claimed is:

1. A light source, comprising:
a plurality of light emitting diodes, with each of the light emitting diodes sized between 30 microns and 500 microns;
a light guide plate having a first and second surface, with the plurality of light emitting diodes separated from each other and positioned to direct light perpendicular to the first surface into the light guide plate; and
micro-optics associated with the light guide plate and each aligned with one or more of the plurality of light emitting diodes to modify a beam direction of light exiting the second surface, each micro-optic and the one or more light emitting diodes with which it is aligned together forming a light emitting diode unit with adjacent light emitting diode units separated from each other by no more than a distance $d=(L)(\theta)$, where:
$L$=a normal distance from the light source for a viewer,
$\theta=1.220\lambda/D$ in radians;
$\lambda$ is a wavelength of light emitted by the light emitting diodes; and
$D$ is a pupil diameter of the viewer.

2. The light source of claim 1, wherein adjacent light emitting diode units are positioned at least 1 millimeter apart.

3. The light source of claim 1, wherein a Z-height of the light source is less than 1 centimeter.

4. The light source of claim 1, wherein the light emitting diodes are flip chip mounted and further comprise a phosphor conversion layer.

5. The light source of claim 1, wherein at least some of the plurality of light emitting diodes are individually controlled through connected traces.

6. The light source of claim 1, wherein at least two of the plurality of light emitting diodes are positioned under a single micro-optic.

7. The light source of claim 1, wherein at least four of the plurality of light emitting diodes are RGBY LEDs positioned under a single micro-optic.

8. The light source of claim 1, wherein at least some of the plurality of light emitting diodes are positioned under a single off-axis micro-optic.

9. The light source of claim 1, wherein the normal distance is defined by a distance from a standing or sitting user to a light in a ceiling.

10. The light source of claim 1, wherein:
each of the plurality of micro-optics associated with the light guide plate are sized less than 1 millimeter; and, a combined height of the light emitting diode units and a supporting substrate on which they are arranged is less than 1 centimeter.

11. The light source of claim 10, wherein the adjacent light emitting diode units are positioned at least 1 millimeter apart.

12. The light source of claim 10, wherein a Z-height of the light source is less than 1 centimeter.

13. The light source of claim 10, wherein the light emitting diodes are flip chip mounted and further comprise a phosphor conversion layer.

14. The light source of claim 10, wherein at least some of the plurality of light emitting diodes are individually controlled through connected traces.

15. The light source of claim 10, wherein at least two of the plurality of light emitting diodes are positioned under a single micro-optic.

16. The light source of claim 10, wherein at least four of the plurality of light emitting diodes are RGBY LEDs positioned under a single micro-optic.

17. The light source of claim 10, wherein at least some of the plurality of light emitting diodes are positioned under a single off-axis micro-optic.

18. The light source of claim 10, wherein the light source is used for architectural lighting.

19. The light source of claim 1, wherein the light guide plate includes a plurality of cavities, and the plurality of light emitting diodes are attached at least partially within the plurality of cavities.

* * * * *